United States Patent [19]

Preston

[11] 3,794,892

[45] Feb. 26, 1974

[54] SEMICONDUCTIVE ENCODER

[75] Inventor: Frank S. Preston, Fairfield, Conn.

[73] Assignee: United Aircraft Corporation, East Hartford, Conn.

[22] Filed: Mar. 16, 1965

[21] Appl. No.: 440,154

[52] U.S. Cl. .......... 317/235 R, 307/304, 307/308, 317/235 B, 317/235 M, 340/347, 340/357

[51] Int. Cl. .......... H011 11/00, H011 15/00

[58] Field of Search .......... 340/347, 357, 358, 345; 307/88.5; 317/234, 235

[56] References Cited

UNITED STATES PATENTS

| | | | |
|---|---|---|---|
| 3,356,915 | 12/1967 | Pomerantz | 317/235 |
| 3,289,093 | 11/1966 | Wanlass | 307/304 |
| 3,201,574 | 8/1965 | Szekely | 307/88.5 |
| 3,287,723 | 11/1966 | Metcalf | 340/347 |
| 3,305,708 | 2/1967 | Ditrick | 307/88.5 |

*Primary Examiner*—John S. Heyman
*Assistant Examiner*—Andrew J. James
*Attorney, Agent, or Firm*—Shenier and O'Connor

[57] ABSTRACT

A semiconductive encoder comprises a rotor having field-effect transistors the insulated gates of which are mounted on a stator. The stator comprises a backwardly biased p-n pattern which creates dielectric fields for the rotor transistors. Relative movement between rotor and stator varies the current through the insulated-gate field-effect transistors to provide a digital indication of the relative position of rotor and stator.

38 Claims, 1 Drawing Figure

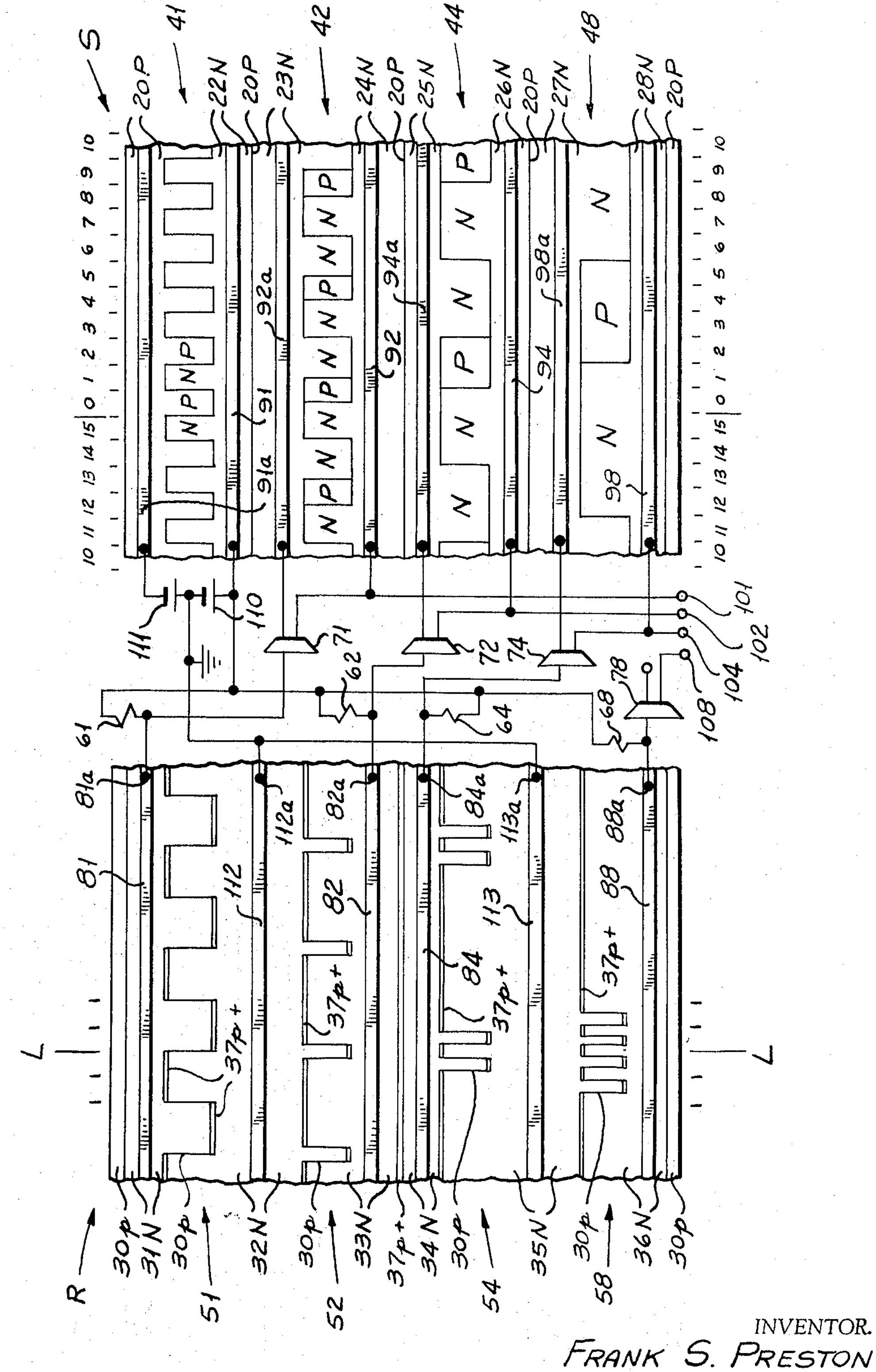
INVENTOR.
FRANK S. PRESTON
BY
Shenier & O'Connor
ATTORNEYS

SEMICONDUCTIVE ENCODER

SUMMARY OF THE INVENTION

My invention relates to semiconductive encoders and more particularly to noncontacting encoders employing insulated-gate field-effect transistors.

One object of my invention is to provide an encoder in which the patterns are formed of semiconductive materials.

Another object of my invention is to provide a noncontacting encoder employing insulated-gate field-effect transistors.

Still another object of my invention is to provide a noncontacting encoder having a high counting speed which does not require the use of an alternating current carrier.

A further object of my invention is to provide an encoder providing an unambiguous output in which the logic for eliminating ambiguity is largely internal.

Other and further objects of my invention will appear from the following description.

In general my invention contemplates the provision of a stator formed of a low-resistivity P-type material. Surface diffusions are performed to convert various areas of the stator into N-type regions thereby creating a pattern of N and P areas. I provide a rotor formed of a high resistivity p-type material. Substantially the entire surface area is subjected to diffusions to create N-type patterns which are separated only by narrow p-type channels. Adjacent N-type areas comprise the source and drain of an insulated-gate field-effect transistor. By subjecting this channel to a positive polarity dielectric field, negative charges are attracted to the surface of the high-resistivity p-type channel thus inducing an n-type inversion layer at the surface and causing an increased flow of current from the drain to the source. If, on the other hand, the channel is subjected to a negative polarity dielectric field the current flow from drain to source is reduced. In order to define the active regions of the p-type channel, certain portions are rendered ineffective to control current flow by a p+ surface diffusion which reduces the resistivity and creates a large number of holes so that electrons induced by immersion in a positive polarity dielectric field cannot produce an n-type surface inversion layer. The rotor and stator patterns are placed in close proximity; and voltages are applied to the stator patterns. Relative motion between rotor and stator will thus cause variation of the drain current in the field-effect transistors of the rotor.

The accompanying drawing, which forms part of the instant specification and which is to be read in conjunction therewith, shows a developed view of the rotor and stator patterns and the interconnection of elements to provide an unambiguous output.

Referring now more particularly to the drawing, a rotor indicated generally by the reference character R is formed of a disc of high-resistivity p-type silicon. The various N-type regions forming the sources and drains are created by a phosphorous diffusion. N-type drain region 31 is formed at the outer diameter of rotor R; and N-type source region 32 is formed immediately adjacent. Between regions 31 and 32 there remains a line pattern or channel having a thickness of approximately 1 mil, which is indicated generally by the reference numeral 51 and comprises the p-type substrate 30. Pattern 51 comprises eight equally spaced radially extending legs connected by eight circumferentially extending segments of alternately different radii. The circumferentially extending segments of the line pattern 51 are subjected to a boron surface diffusion which creates p+ guard segments 37. No current can flow between source 32 and drain 31 through the guard segments 37. Circumferentially extending aluminum contact rings 81 and 112 engage respective regions 31 and 32. An N-type region 33 is formed immediately adjacent the region 32 but separated therefrom by a line pattern indicated generally by the reference numeral 52 which comprises the p-type substrate 30.

I have shown an encoder which counts from 0 to 15 and thus divides a circle into 16 intervals. One of the radially extending legs of pattern 51 is aligned with a reference line L. Pattern 52 comprises four equally spaced depending fingers, one of which is symmetrically disposed about reference line L. The spacing between the two legs of each finger of pattern 52 is less than one interval. The surfaces of the circumferentially extending segments of pattern 52 are subjected to a boron diffusion, converting them to p+ guard segments 37. An aluminum ring contact 82 engages area 33. A further N-type area 34 is disposed adjacent area 33 but separated therefrom by a continuous circular p+ guard ring 37 which comprises the p-type substrate into the surface of which is diffused boron. Adjacent area 34 is another N-type area 35 but which is separated therefrom by a line pattern, indicatd generally by the reference numeral 54, of the p-type substrate 30. Pattern 54 comprises two diametrically opposed pairs of depending fingers each comprising a group of four legs. One pair of fingers is symmetrically disposed about line L; and each pair subtends less than two intervals. The surfaces of the circumferentially extending segments of pattern 54 are diffused to create p+ guard segments 37. An aluminum ring contact 113 engages region 35. An innermost N-type region 36 is disposed adjacent region 35 but is separated therefrom by a line pattern 58 comprising the p-type substrate 30. Pattern 58 comprises four depending fingers symmetrically spaced about the reference line L and subtending less than four intervals. The surfaces of the circumferentially extending segments of pattern 58 comprise p+ guard segments 37. An aluminum ring 88 contacts region 36. The widths of the line patterns 51 through 58 may each be 1 mil as well as the p+ guard ring 37 which isolates adjacent regions 33 and 34.

It will be noted that for patterns 52, 54, and 58 I have shown the short, circumferentially extending segments joining the legs of a group to be formed of p+ material. However, as will be appreciated by those ordinarily skilled in the art, it is sufficient that only the long, circumferentially extending segments joining one group to another be formed of p+ material. Accordingly I may omit the p+ surface diffusion for the four short segments of pattern 52, for the six short segments of pattern 54, and for the seven short segments of pattern 58.

The stator is indicated generally by the reference character S and comprises a substrate 20 of low resistivity P-type silicon. An outermost region of N-type material 22 has external teeth which subtend the odd intervals, thereby defining internally extending P-type teeth of the substrate 20 which subtend the even intervals. The boundary between the N and P teeth defines a pattern indicated generally by the reference numeral 41. An aluminum ring 91*a* contacts the substrate 20.

An aluminum ring 91 contacts the region 22. An N-type region 23 is adjacent region 22 but separated therefrom by an isolating ring 20 of the P-type substrate, which may have a width of approximately 1 mil. An N-type region 24 is adjacent region 23 but separated therefrom by a pattern 42 comprising in part lines and in part areas of the P-type substrate 20. For pattern 42, the P-type substrate comprises four equally spaced areas each subtending one interval length. One area is centered about the 0-1 transfer point and extends from the midpoint of the 0 interval to the midpoint of the 1 interval. Region 23 comprises four equally-spaced internally extending teeth each of which subtends one and one-half intervals; and one tooth extends from the midpoint of the 1 interval to the 2-3 transfer point. The region 24 comprises four equally spaced externally extending teeth each of which subtends one and one-half intervals; and one tooth extends from the 2-3 transfer point to the midpoint of the 4 interval. The line portions of pattern 42, which join the P-type areas, may each have a width of approximately 1 mil. One line portion of pattern 42 comprises a radially extending leg at the 2-3 transfer point. This leg is joined by a first circumferential segment extending from the 2-3 transfer point to the midpoint of the 4 interval and by a second circumferential segment extending from the 2-3 transfer point to the midpoint of the 1 interval. Each segment in turn joins a P-type area. Aluminum rings 92 and **92*a* contact respective regions 24 and 23. Adjacent region 24 is a further N-type region 25 which is separated therefrom by an isolating ring of the P-type substrate 20. Adjacent region 25 is an N-type region 26 which is separated therefrom by a pattern 44 comprising in part lines and in part areas of the P-type substrate 20. For pattern 44, the P-type substrate comprises two diametrically opposed areas each subtending two interval lengths; and one area subtends the 1 and 2 intervals. Region 26 comprises two externally extending diametrically opposed teeth each subtending three intervals; and one tooth extends through the 6, 7, and 8 intervals. Region 25 comprises two diametrically opposed internally extending teeth each subtending three intervals; and one tooth extends through the 3, 4, and 5 intervals. Aluminum rings 94 and 94*a* contact respective regions 26 and 25. Adjacent region 26 is an N-type region 27 which is separated therefrom by an isolating ring of the P-type substrate 20. Adjacent region 27 is an innermost N-type region 28 which is separated therefrom by a pattern 48 comprising in part areas and in part lines of the P-type substrate 20. For pattern 48, there is only one P-type area which subtends four intervals and extends through the 2, 3, 4, and 5 intervals. Region 28 comprises one externally extending tooth which subtends six intervals and extends through the 12, 13, 14, 15, 0, and 1 intervals. Region 27 has one internally extending tooth which subtends six intervals and extends through the 6, 7, 8, 9, 10, and 11 intervals. The line portions of each of patterns 42, 44, and 48 may each have a width of approximately 1 mil. The isolating rings of the P-type substrate separating regions 22 and 23, 24 and 25, and 26 and 27** may also have a width of approximately 1 mil.

The rotor and stator discs are mounted coaxially with a small air gap spacing between their parallel surfaces. The end play of the rotor should be held to a minimum in order to maintain the minimum possible spacing which may be of the order of magnitude of 10 mils. The six aluminum contact rings of the rotor are conductively connected to six corresponding slip rings (not shown) which are mounted on the back surface of the rotor. A stationary brush **81*a* engages the slip ring connected to contact ring 81; a brush 112*a* engages the slip ring connected to contact ring 112; a brush ring 82*a* engages the slip ring connected to contact ring 82; a brush 84*a* engages the slip ring connected to the contact ring 84; a brush 113*a* engages the slip ring conductively connected to the contact ring 113; and a brush 88a engages the slip ring connected to the contact ring 88. Five brushes and five slip rings are sufficient however, since contact rings 112 and 113 may both be connected to a common slip ring on the back surface of the rotor disk; and one of brushes 112*a* and 113*a*** may be eliminated. Conductive connections to the eight stator contact rings are brought out on the back surface of the stator. It will be appreciated that since the air gap spacing between rotor and stator surfaces is extremely small, no space is available for any rotor brushes or stator connections in the air gap.

The negative terminal of a battery 110 and the positive terminal of a battery 111 are grounded. Each of batteries 110 and 111 may provide a potential of 20 volts. The negative terminal of battery 111 is connected to contact ring **91*a*; and the positive terminal of battery 110 is connected to contact ring 91. The positive terminal of battery 110 is further connected through respective drain resistors 61, 62, 64, and 68 to respective drain brushes 81*a*, 82*a*, 84*a*, and 88*a*. Common source brushes 112*a* and 113*a* are grounded. Brushes 81*a*, 82*a*, 84*a*, and 88*a* are connected to the respective inputs of bistable flip-flops 71, 72, 74, and 78,** each of which provides a pair of complementary outputs.

When the P-type teeth of pattern 41 at a potential of −20 volts overlie the radially extending active p-type legs 30 of pattern 51, the current flow through drain resistor 61 may be 1 milliampere or less. When the N-type teeth of pattern 41 at a potential of +20 volts overlie the active radially extending p-type legs 30 of pattern 51, the current through drain resistor 61 may be 11 milliamperes. Substantially no current flows between regions 22 and 20 since they form a backwardly biased junction. Drain resistors 61 through 68 may each have a resistance value of 1 kilohm so that the voltage across a drain resistor varies between 1 volt when a transistor is nonconductive and 11 volts when a transistor is conductive. With the field-effect transistor defined by pattern 51 nonconductive, the input to flip-flop 71 is at a potential of 19 volts. Correspondingly, the upper output of flip-flop 71 is at a potential of +19 volts and the lower output of flip-flop 71 is at a potential of −19 volts. With the transistor defined by pattern 51 conductive, the input of flip-flop 71 drops to 9 volts; and the upper output of flip-flop 71 changes to −19 volts while the lower output changes to +19 volts. Each of the flip-flops may have a similar construction and change state at a critical triggering current of 3 milliamperes through, and correspondingly a triggering potential of 3 volts across, the drain resistor. For each of flip-flops 71 through 78, the change in voltage of the upper output is in the same sense as the change in voltage of the input; while the change in voltage of the lower output is of a sense opposite to that of the change in voltage of the input.

The upper output of flip-flop 71 is connected to contact ring 92*a;* and the lower output thereof is connected to contact ring 92 and to an output terminal 101 at which is provided the least significant digit of a binary coded output. The upper output of flip-flop 72 is connected to contact ring 94*a;* and the lower output thereof is connected to contact ring 94 and to an output terminal 102 at which is provided the next-to-least significant digit of the binary coded output. The upper output of flip-flop 74 is connected to contact ring 98*a;* and the lower output thereof is connected to contact ring 98 and to a terminal 104 at which appears the next-to-most significant digit of the binary coded output. The lower output of flip-flop 78 is connected to a terminal 108 at which appears the most significant digit of the binary coded output. The upper outputs of the flip-flops provide a representation of the complement of the digital output appearing at terminals 101 through 108. An output of +19 volts at any of terminals 101 through 108 represents a 1 in the binary code; while an output of −19 volts represents a binary 0.

In operation of my encoder, when line L of the rotor overlies any of the even intervals, the transistor defined by pattern 51 is nonconductive; and the output at terminal 101 is negative, representing a 0. When line L overlies any of the odd intervals, the transistor defined by pattern 51 is conductive; and the output at terminal 101 is positive, representing a 1. During the last half of the 15 interval the fingers of pattern 52 overlie the teeth of region 24; the pairs of fingers of pattern 54 overlie the teeth of region 26; and the four fingers of pattern 58 overlie the tooth of region 28. Since a 1 output exists at terminal 101 during the odd 15 interval, region 24 is at a positive potential; and substantially 11 ma flows through drain resistor 62, producing a 1 output at terminal 102 and a positive potential in region 26. Since region 26 is at a positive potential, substantially 11 ma flows through drain resistor 64, producing a 1 output at terminal 104 and a positive potential in region 28. With region 28 at a positive potential, substantially 11 ma flows through drain resistor 68, producing a 1 at terminal 108. At the 15-0 transfer point the current through drain resistor 61 drops to slightly less than 3 ma, causing flip-flop 71 to change state, producing a 0 at terminal 101 and a negative potential in region 24. The negative potential in region 24 reduces the current through drain resistor 62 to 1 ma, causing flip-flop 72 to change state, producing a 0 at terminal 102 and a negative potential in region 26. The negative potential in region 26 reduces the current through drain resistor 64 to 1 ma causing flip-flop 74 to change state, producing a 0 at terminal 104 and a negative potential in region 28. The negative potential in region 28 reduces the current through drain resistor 68 to 1 ma, causing flip-flop 78 to change state and provide a 0 at output terminal 108. When reference line L reaches the midpoint of the 0 interval the leading legs of the fingers of pattern 52 pass from the influence of the teeth of region 24 into the influence of the P-type areas of pattern 42. Also adjacent the midpoint of the 0 interval the leading legs of the leading fingers of pattern 54 also pass from the influence of region 26 into the influence of the P-type areas of pattern 44; and the leading leg of the leading finger of pattern 58 passes from the influence of region 28 into the influence of the P-type area of pattern 48. However, all P-type areas of the stator S are at a constant potential of −20 volts so that the field-effect transistors defined by patterns 52, 54, and 58 remain nonconductive. At the 0-1 transfer point, the current through drain resistor 61 increases to slightly more than 3ma, causing flip-flop 71 to change state and produce a negative potential in region 23. At the 0-1 transfer point the fingers of pattern 52 are solely under the influence of the P-type areas of pattern 42; and the current through drain resistor 62 remains 1 ma. Slightly before line L reaches the midpoint of the 1 interval the leading legs of the fingers of pattern 52 disengage the P-type areas of pattern 42 and engage the teeth of region 23. The current through drain resistor 62 remains 1 ma. At the 1-2 transfer point, the fingers of pattern 52 are solely under the influence of region 23 which at that instant changes from a negative to positive potential, producing a drain current of 11 ma through resistor 62 and causing flip-flop 72 to change state and produce a negative potential in region 25. But at the 1-2 transfer point, the pairs of fingers of pattern 54 are solely under the influence of the P-type areas of pattern 44, so that the current through drain resistor 64 remains 1 ma. Slightly after the midpoint of the 2 interval the leading legs of the fingers of pattern 52 pass from the influence of region 23, which is at a positive potential, into the influence of region 24, which is at a negative potential, so that immediately prior to the 2-3 transfer point the leading legs of the fingers of pattern 52 are nonconductive while the trailing legs of the fingers are conductive. The current through drain resistor 62 decreases from 11 ma to 6 ma. The current flow through the conductive legs is 5.5 ma; and the current flow through the nonconductive legs is 0.5 ma. The total current is thus one-half the sum of 11 ma and 1 ma. However, flip-flop 72 does not change state, since the current flow is still appreciably greater than 3 ma. At the 2-3 transfer point, flip-flop 71 changes state causing region 24 to assume a positive potential and region 23, a negative potential. The leading legs of the fingers of pattern 52 are now conductive while the lagging legs are now nonconductive. The current through resistor 62 remains 6 ma and flip-flop 72 does not change state. As line L moves further into the 3 interval, the lagging legs of the fingers of pattern 52 pass into the influence of region 24; and the current through resistor 62 increases again to 11 ma. At the 3-4 transfer point flip-flop 71 changes state causing the potential of region 24 to become negative. Since the fingers of pattern 52 lie solely under the influence of the teeth of region 24, the current through resistor 62 drops to 1 ma causing flip-flop 72 to change state. During the 2 and 3 intervals the fingers of pattern 54 move from the influence of the P-type areas of pattern 44 into the influence of the teeth of region 25 which is at a negative potential. At the 3-4 transfer point, the change in state of flip-flop 72 causes the potential of region 25 to become positive, producing a current of 11 ma through resistor 64, which in turn causes flip-flop 74 to change state. The four fingers of pattern 58, however, are solely under the influence of the P-type area of pattern 48; and flip-flop 78 does not change state. During the 5 and 6 intervals adjacent the 5-6 transfer point, the current through resistor 64 drops from 11 ma to 6 ma and then increases from 6 ma to 11 ma. However, flip-flop 74 does not change state. Also, during the 10, 11, 12, and 13 intervals adjacent the 11-12 transfer point the current through resistor 68 decreases from 11 ma to 6 ma and then rises from 6 ma to 11 ma; however flip-flop 78 does not change state.

Region 32 serves as a common source for drain regions 31 and 33; and region 35 serves as a common source for drain regions 34 and 36. Accordingly, I need provide but two source contact rings 112 and 113 for the four rotor transistors. Furthermore, only one circular p+ guard ring 37 need be provided to secure electrical isolation between the drain regions 33 and 34. The surfaces of substantially all circumferentially extending segments of the rotor patterns 51 through 58 are converted to p+ guard segments; and current can flow between the sources and drains of the transistors only across the radially extending legs of the line patterns. It will be further noted that each of the insulated-gate field-effect transistors has the same channel length since each of the four transistors comprises eight radially extending legs. Accordingly all transistors have substantially the same transconductance.

It will be noted that for the stator, the line portions of patterns 42, 44, and 48 as well as the three circular isolation rings separating the four patterns comprise the P-type substrate. However, no N region of the stator can be more negative than −19 volts, while the P-type substrate is at a potential of −20 volts. Accordingly, the junctions between the N regions and the P-type substrate are backwardly biased to insure that no current can flow between adjacent N regions through the P-type substrate. No currents flow in the stator patterns except due to leakage across backwardly biased junctions and capacitive transients during switching of flip-flops 71, 72, and 74. The substrate P-type areas of the stator patterns, in addition to completing the isolation between the various pairs of N regions, also render the transistor defined by pattern 51 nonconductive during all even intervals and further render the transistors defined by patterns 52, 54 and 58 nonconductive adjacent certain transfer points, where the pairs of N regions defining patterns 42, 44, and 48 change potential. An oxide passivating layer is grown over the patterned surfaces of rotor and stator. Such oxide layer creates an interface which insures the production of an n-type surface inversion layer in the p-type channels of the rotor transistors.

For circuit 71, the current through drain resistor 61 exhibits a fairly rapid change from maximum to minimum value, so that for a constant rotor speed, the current waveform is trapezoidal. Relatively high gain is desirable in circuit 71 to insure that the output waveform is rectangular with a substantially instantaneous change. However circuits 72, 74, and 78 may have a relatively low gain. For example, the upper output of circuit 72 may be +19 volts only for currents less than 2 ma through resistor 62 and −19 volts only for currents greater than 4 ma through resistor 62.

It will be appreciated that my encoder may be arranged to operate in response to linear motion as well as rotary motion. The various semiconductive regions will then resemble superposed racks of teeth rather than concentric rings of teeth. The isolating segments will extend longitudinally of the rack; and the channels of the field-effect transistors will extend transversely of the rack.

It will also be appreciated that I may employ a low-resistivity N-type stator substrate and a high-resistivity n-type rotor substrate. The patterns are then formed by surface diffusions creating P-type regions. A p-type surface inversion layer is created in the rotor substrate channels when they are subjected to a negative polarity dielectric field. The rotor guard segments and guard ring are formed by a diffusion which lowers the resistivity of the surface of the n-type channels to create a large surplus of electrons so that no p-type surface inversion layer can be produced.

It will be also noted that I may reverse the roles of rotor and stator. However this will require eight brushes and eight slip-rings instead of only five or six brushes and slip rings for the embodiment shown.

It will be seen that I have accomplished the objects of my invention.

In my encoder the patterns of both rotor and stator are formed of semiconductive materials. My encoder has no commutating contacts. The sensing elements of my encoder comprise insulated-gate field-effect transistors. My encoder does not require the use of an alternating current carrier but instead operates on direct-current potentials and has an extremely high counting speed. In my encoder substantially all of the switching logic is internal by virtue of the pairs of stator patterns which receive complemental excitation.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A semiconductive encoder including in combination a substrate formed of a semiconductor of one conductivity type having a surface portion formed of a semiconductor of the opposite conductivity type, the surface portion having the shape of a rack of teeth, the surface portion and the substrate forming a rectifying junction, and means for backwardly biasing the junction.

2. A semiconductive encoder including in combination a substrate formed of a semiconductor of one conductivity type having two surface portions each formed of a semiconductor of the opposite conductivity type, the surface portions having the shape of two intermeshing racks of teeth, the teeth intermeshing along a pattern comprising a thin and substantially line-like transversely extending leg, each end of the leg being joined by a longitudinally extending thin and substantially line-like segment, each segment being joined by an area having an appreciable longitudinal extent and a transverse extent substantially equal to that of the leg, the leg and the segments and the areas of the pattern comprising the substrate, each surface portion and the substrate forming a rectifying junction, and means for backwardly biasing each junction.

3. An encoder as in claim 2 in which all teeth have the same longitudinal extent and in which the longitudinal extent of each area is two-thirds that of a tooth.

4. An encoder as in claim 2 in which the biasing means comprises means for providing a pair of complementary two-state voltages and means for coupling said voltages to the surface portions.

5. A semiconductive encoder including in combination a substrate formed of a semiconductor of one conductivity type having two surface portions each formed of a semiconductor of the opposite conductivity type, each surface portion having the shape of a rack of teeth, the portions being separated by an uninterrupted area comprising the substrate, each surface portion and the substrate forming a rectifying junction, and means for backwardly biasing each junction.

6. A semiconductive encoder including in combination a substrate formed of a high-resistivity semiconductor of one conductivity type having two surface portions each formed of a semiconductor of the opposite conductivity type, the surface portions having the shape of two intermeshing racks of teeth, the teeth intermeshing along a thin and substantially line-like pattern having transversely extending legs which are joined by longitudinally extending segments, the legs comprising the substrate, the major part of the surfaces of the segments being formed of a low-resistivity semiconductor of said one conductivity type, and means for establishing a potential difference between the two surface portions.

7. A semiconductive encoder as in claim 6 in which the legs are equally spaced.

8. A semiconductive encoder as in claim 6 in which the pattern comprises a plurality of widely spaced groups of closely-spaced legs, each group having a number of legs equal to $2^n$, where $n = 1, 2, 3, \ldots$

9. A semiconductive encoder including in combination a substrate formed of a high-resistivity semiconductor of one conductivity type having three surface portions each formed of a semiconductor of the opposite conductivity type, the first and second portions having the shape of two intermeshing racks of teeth, the second and third portions having the shape of a pair of intermeshing racks of teeth, the teeth intermeshing along thin and substantially line-like patterns each having transversely extending legs joined by longitudinally extending segments, the legs comprising the substrate, the major part of the surfaces of the segments being formed of a low-resistivity semiconductor of said one conductivity type, a source of potential having a first and a second terminal, means connecting the first portion to the first terminal, means connecting the second portion to the second terminal, and means connecting the third portion to the first terminal.

10. A semiconductive encoder including in combination a substrate formed of a high-resistivity semiconductor of one conductivity type having two surface portions each formed of a semiconductor of the opposite conductivity type, each portion having the shape of a rack of teeth, the portions being separated by an uninterrupted area formed of a low-resistivity semiconductor of said one conductivity type.

11. A semiconductive transducer including in combination an insulated-gate field-effect transistor having a source and a drain and a channel therebetween, means establishing a potential difference between the source and the drain, means for establishing a dielectric field, means for moving the channel relative to and within the influence of the field, a bistable trigger circuit, and means responsive to the flow of drain current for triggering the circuit.

12. A semiconductive transducer including in combination an insulated-gate field-effect transistor having a source and a drain and a channel therebetween, means establishing a potential difference between the source and the drain, means for establishing a dielectric field, means for moving the channel relative to and within the influence of the field, said field producing drain currents ranging between a certain maximum and a certain minimum value, a circuit actuatable to provide a two-state output, means responsive to the flow of drain current for actuating the circuit, the circuit having the characteristic of providing a first state output for drain currents less than a first current which is appreciably greater than said minimum current and of providing a second state output for drain currents greater than a second current which is appreciably less than one-half the sum of said maximum and minimum currents.

13. A semiconductive transducer including in combination an insulated-gate field-effect transistor, means for establishing a dielectric field, and means for moving the transistor relative to and within the influence of the dielectric field.

14. A semiconductive transducer including in combination an insulated-gate field-effect transistor, a semiconductive body having a surface, means for establishing differing potentials in various areas of the surface to create dielectric fields in the regions adjacent said surface, and means for moving the transistor parallel to said surface and within the influence of said fields.

15. A semiconductive transducer including in combination a substrate formed of a high-resistivity semiconductor of one conductivity type having two surface portions each formed of a semiconductor of the opposite conductivity type, the two portions abutting along a thin and substantially line-like pattern comprising the substrate, means for establishing a dielectric field, and means for moving the pattern relative to and within the influence of the dielectric field.

16. A semiconductive transducer including in combination a substrate formed of a high-resistivity semiconductor of one conductivity type having two surface portions each formed of a semiconductor of the opposite conductivity type, the two portions abutting along a thin and substantially line-like pattern comprising the substrate, a semiconductive body having a surface, means for establishing differing potentials in various areas of the surface to create dielectric fields in the regions adjacent the surface, and means for moving the pattern parallel to said surface and within the influence of said fields.

17. A semiconductive transducer including in combination an insulated-gate field-effect transistor having a source and a drain and a channel therebetween, means establishing a potential difference between the source and the drain, means for establishing a dielectric field pattern, and means for moving the channel relative to and within the influence of said dielectric field pattern to vary the flow of drain current.

18. A semiconductive transducer as in claim 17 in which the channel has a certain reference position and in which the channel and the field pattern are so formed and disposed that the drain current varies as a predetermined function of displacement from said position.

19. A semiconductive transducer as in claim 17 in which the channel has a certain reference position and in which the channel and the field pattern are so formed and disposed that the drain current varies as a substantially linear function of displacement from said position.

20. A semiconductive transducer as in claim 17 in which the channel has a certain reference position and in which the channel and the field pattern are so formed and disposed that the drain current varies as a step-function of displacement from said position.

21. A semiconductive transducer as in claim 17 in which the channel has a certain reference position and in which the channel and the field pattern are so formed and disposed that the drain current varies with displacement from said position as a stair-case function having a plurality of steps.

22. A semiconductive transducer including in combination an insulated-gate field-effect transistor, means including a voltage source for establishing a dielectric field, means for moving the transistor relative to and within the influence of the field, and means for varying the source voltage thereby to vary said dielectric field.

23. A semiconductive transducer including in combination an insulated-gate field-effect transistor, means including a variable voltage source for establishing a variable dielectric field, and means for moving the transistor relative to and within the influence of said field.

24. A semiconductive transducer including in combination an insulated-gate field-effect transistor, means including a time-varying voltage source for establishing a time-varying dielectric field, and means for moving the transistor relative to and within the influence of said field.

25. A semiconductive transducer including in combination an insulated-gate field-effect transistor, means including an alternating voltage source for establishing an alternating dielectric field, and means for moving the transistor relative to and within the influence of said field.

26. A semiconductive transducer including in combination a first and a second member, an insulated-gate field-effect transistor having a source and a drain and a channel therebetween and a gate, means mounting the source and the drain and the channel on the first member, means mounting the gate on the second member, and means mounting the first and second members for relative movement.

27. A transducer comprising: a field-effect transistor having a source electrode and drain electrode separated by a channel, an insulating layer covering said source and drain electrodes and said channel, and a gate electrode disposed over said channel and separated therefrom by said insulating layer; means for applying a predetermined potential to said gate electrode; ane means for moving said gate electrode with respect to said channel so as to control the conduction characteristics of said field-effect transistor.

28. A transducer as in claim 27 wherein said means for moving said gate electrode with respect to said channel comprises: a member having a gate electrode thereon, said member being disposed so as to be directly above said channel; and means for rotating said member so as to move said gate electrode with respect to said channel so as to vary the conduction characteristics of said field-effect transistor.

29. A transducer as in claim 27 wherein said source and drain electrodes comprise metallic regions deposited on a substrate and said channel contains a semiconductor material of a predetermined conductivity type.

30. A variable impedance means comprising: a field-effect transistor having an elongated source and drain electrode disposed so as to define an elongated channel therebetween, an insulating layer for covering said source and drain electrode and said channel, and an elongated gate electrode directly disposed over said channel and separated therefrom by said insulating layer, said gate electrode being intimately disposed relative to said insulating layer and moveable in the elongated direction of said channel; means for applying a predetermined potential to said gate electrode; and means for moving said gate electrode with respect to said channel so as to control the conduction characteristics of said field-effect transistor.

31. A variable impedance means as in claim 30 wherein said source and drain electrodes are n-type regions diffused into a p-type semiconductor wafer.

32. A variable impedance means as in claim 30 wherein said source and drain electrodes are p-type regions diffused into an n-type semiconductor wafer.

33. A variable impedance means as in claim 30 wherein said channel is lightly doped and said source and drain electrodes are heavily doped.

34. A variable impedance means comprising: a metal oxide semiconductor device having a source electrode and drain electrode diffused into a semiconductor wafer so as to define a channel therebetween, an insulating layer covering said source and drain electrode and said channel, and a gate electrode disposed over said channel and separated therefrom by said insulating layer, said gate electrode being intimately disposed relative to said insulating layer; means for connecting said gate electrode to a proper potential; and means for moving said gate electrode with respect to said channel so as to control the conduction characteristics of said semiconductor device.

35. A variable impedance means as in claim 34 wherein said source and drain electrodes are elongated regions diffused into a semiconductor wafer so as to define an elongated channel therebetween and said gate electrode is moveable in the elongated direction of said channel.

36. A variable impedance means as in claim 34 wherein said source and drain electrodes are n-type regions and said semiconductor wafer is a p-type semiconductor material.

37. A variable impedance means as in claim 34 wherein said semiconductor wafer is an essentially mono-crystalline body of silicon.

38. A variable impedance means as in claim 34 wherein said semiconductor wafer is an essentially mono-crystalline body of high resistivity p-type silicon.

* * * * *